United States Patent
Yoshizawa et al.

(10) Patent No.: US 8,114,685 B2
(45) Date of Patent: Feb. 14, 2012

(54) METHOD OF MANUFACTURING MATERIAL TO BE ETCHED

(75) Inventors: Tatsuya Yoshizawa, Tsurugashima (JP); Kenichi Nagayama, Tsurugashima (JP); Takuya Hatakeyama, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 873 days.

(21) Appl. No.: 12/065,755

(22) PCT Filed: Aug. 25, 2006

(86) PCT No.: PCT/JP2006/316701
§ 371 (c)(1),
(2), (4) Date: Jul. 24, 2008

(87) PCT Pub. No.: WO2007/029523
PCT Pub. Date: Mar. 15, 2007

(65) Prior Publication Data
US 2009/0197353 A1    Aug. 6, 2009

(30) Foreign Application Priority Data
Sep. 5, 2005    (JP) .................................. 2005-256946

(51) Int. Cl.
*H01L 21/66*    (2006.01)

(52) U.S. Cl. ............ 438/8; 257/E21.525; 216/5; 216/41

(58) Field of Classification Search .................. None
See application file for complete search history.

(56) References Cited

U.S. PATENT DOCUMENTS

| | | | | |
|---|---|---|---|---|
| 4,260,670 A * | 4/1981 | Burns | ................................ | 430/5 |
| 4,301,237 A * | 11/1981 | Burns | ............................ | 430/394 |
| 5,249,520 A * | 10/1993 | Andris et al. | ................. | 101/126 |
| 5,677,011 A * | 10/1997 | Hatakeyama et al. | ......... | 427/497 |
| 5,708,267 A * | 1/1998 | Hatakeyama | .................. | 250/251 |
| 5,770,123 A * | 6/1998 | Hatakeyama et al. | ......... | 264/1.21 |
| 5,852,298 A * | 12/1998 | Hatakeyama et al. | ...... | 250/492.2 |
| 5,868,952 A * | 2/1999 | Hatakeyama et al. | ............ | 216/66 |
| 6,015,976 A * | 1/2000 | Hatakeyama et al. | ... | 250/492.23 |
| 6,214,631 B1 * | 4/2001 | Burrows et al. | .................. | 438/22 |
| 6,316,289 B1 * | 11/2001 | Chung | ............................ | 438/118 |
| 6,403,392 B1 * | 6/2002 | Burrows et al. | .................. | 438/22 |
| 6,835,317 B2 * | 12/2004 | Hatamura et al. | ................ | 216/11 |
| 2007/0157879 A1 * | 7/2007 | Yotsuya | ........................ | 118/505 |
| 2010/0252927 A1 * | 10/2010 | Wong et al. | .................... | 257/741 |

FOREIGN PATENT DOCUMENTS

| | | |
|---|---|---|
| JP | 08-206866 A | 8/1996 |
| JP | 2004-006930 A | 1/2004 |
| JP | 2004-127726 A | 4/2004 |
| JP | 2004-273438 A | 9/2004 |

* cited by examiner

*Primary Examiner* — Allan Olsen
(74) *Attorney, Agent, or Firm* — Sughrue Mion, PLLC

(57) ABSTRACT

A method is provided, of manufacturing a material to be etched that can more preferably prevent a region to be etched from remaining as an un-etched region and reduce deviation of etched/un-etched regions. Patterning (a method of manufacturing a material to be etched) of a substrate 100, which is manufactured by performing etching through an opened region 10 by an etching mask M1, is performed by a first etching process and a second etching process that is performed after the first etching process. The second etching process is a process for etching a region including a region that is not etched by the first etching process. An un-etched region, which is the same as etched using a virtual etching mask M1', is formed on the surface of an object to be etched by the first and second etching processes.

6 Claims, 14 Drawing Sheets

100

100

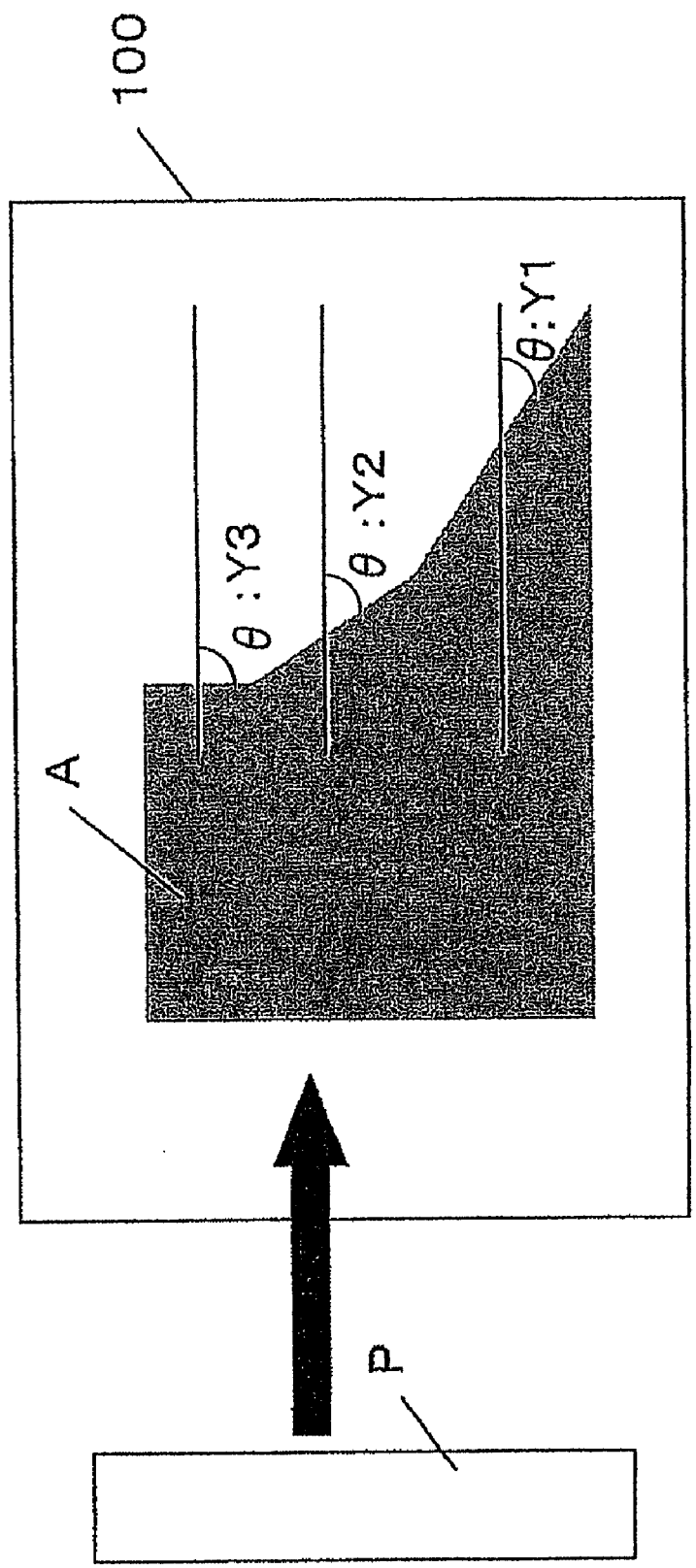

(1)

(2)

METHOD OF MANUFACTURING MATERIAL TO BE ETCHED

CROSS REFERENCE TO RELATED APPLICATIONS

This application is a National Stage of International Application No. PCT/JP2006/316701 filed on Aug. 25, 2006, claiming priority based on Japanese Patent Application No. 2005-256946, filed Sep. 5, 2005, the contents of all of which are incorporated herein by reference in their entirety.

TECHNICAL FIELD

The present invention relates to a method of manufacturing a material to be etched, and more particularly, to a method of manufacturing a material to be etched that manufactures the material to be etched by using an etching mask where a region corresponding to an etched region of an object to be etched is opened and a region corresponding to an un-etched region is not opened and by performing etching through the opened region.

BACKGROUND ART

An organic electroluminescence device has been known as a device using a thin film (hereinafter, referred to as an organic film) that is made of an organic compound forming electroluminescence (hereinafter, referred to as an EL) by the supply of current. The organic EL device is formed by sequentially laminating, for example, transparent electrodes, one or more organic films, and metal electrodes on a transparent substrate.

An organic EL display panel that includes a plurality of organic EL devices as a light-emitting part, for example, a matrix type organic EL display panel is formed by sequentially laminating horizontal line electrodes that include a transparent electrode layer, one or more organic films, vertical row electrodes that include a metal electrode layer crossing the line electrodes. Each of the line electrodes is formed in the shape of a strip. The line electrodes are arranged parallel to each other with a predetermined distance therebetween, and the row electrodes are the same as the line electrodes. As described above, the matrix type display panel has an image display array that includes a plurality of light-emitting pixels of organic EL devices formed at junctions between the plurality of line and row electrodes.

In a process for manufacturing the organic EL display panel, the transparent electrode layer is formed on the transparent substrate, and the organic films are then formed. The organic films are one or more thin films corresponding to the light-emitting pixels, and are formed by a deposition method.

For example, when an organic film is formed on the entire surface of a substrate on which first display electrodes are patterned by a wet process, such as a spin coat method or a spray method, as one method of manufacturing the organic EL device, the organic film formed on electrode lead portions should be removed so that the electrode lead portions come in contact with the first display electrodes. For this purpose, there has been known a method of removing an organic film formed on the electrode lead portion that uses, for example, a photolithographic method, a laser abrasion method, or a method using an etching mask.

First, the photolithographic method includes applying a resist on a thin film formed on a substrate, exposing the resist, dissolving exposed portions of the resist having predetermined patterns in a developer (positive type) or not by dissolving the exposed portions (negative type) in order to form a resist mask, and etching the thin film in order to pattern the thin film into etched and un-etched portions.

In the laser abrasion method, generally, a focused laser beam is radiated onto a thin film in order to vaporize and peel the thin film, and the radiation is selectively repeated to pattern the thin film into peeled and unpeeled portions.

The method using an etching mask is a method using an etching mask where a region corresponding to an etched region of an object to be etched is opened and a region corresponding to a region not to be etched (an un-etched region) is not opened and by performing etching through the opened region. Since the etched region of the object corresponding to the opened region of the etching mask is etched and the un-etched region is not etched, the object is patterned into etched and un-etched portions. For example, a method disclosed in the following Patent Document 1 has been known as the method using an etching mask.

In general, a non-opening portion of an etching mask forms an un-etched region in order to make an un-etched region have the shape of an island surrounded by an etched region.
Patent Document 1: JP-A-2004-273438

DISCLOSURE OF THE INVENTION

Problem that the Invention is to Solve

However, when an island-shaped un-etched region is formed by the method using an etching mask in the related art, a problem may occur. The method in the related art will be described below with reference to drawings.

FIG. 1 shows an etching mask A1 in the related art. The etching mask includes an opening portion 10 and a non-opening portion. The etching mask A1 includes a non-opening portion 12 for an island shape, which is surrounded by the opening portion 10, therein. Since the non-opening portion 12 for an island shape is formed, a region corresponding to the non-opening portion 12 for an island shape can be made as un-etched region. Therefore, it is possible to form an island-shaped un-etched region.

However, the etching mask A1 requires a support portion 16 that is supported by a peripheral member 14 to supports the non-opening portion 12 for an island shape. In this case, a region corresponding to the support portion 16 also forms an un-etched region, and the region corresponding to the support portion 16 may not be etched. In general, the size and the number of the support portions are required to some extent in order to reliably support the non-opening portion for an island shape. The size and the number of the support portions depend on the rigidity of the material of the mask A1. However, in general, two or more support portions are required to one island-shaped non-opening portion, and each of the support portions has, for example, a size of 0.1 mm or more. When the size and the number of the support portions are increased as described above, the above-mentioned problem becomes more serious. Further, if the etching is performed by a method having high anisotropy, it is difficult to etch the back side of the support portion, so that the above-mentioned problem becomes more serious.

In the related art, another problem may occur due to the etching method. For example, FIG. 1A shows a method of removing organic materials by ejecting gas in the form of plasma from a nozzle N onto a substrate 100 through a mask A, that is, an atmospheric-pressure plasma method. In the atmospheric-pressure plasma method, an area of an atmospheric-pressure plasma reaction region P onto which gas is ejected from the nozzle is generally smaller than the area of the substrate 100. Accordingly, as shown in FIG. 1B, the atmospheric-pressure plasma reaction region P or the substrate 100 need to be scanned in order to etch substantially the entire surface of the substrate 100. When the etching is performed while the atmospheric-pressure plasma reaction region P or the substrate 100 is scanned, the etching is obliquely performed in a direction indicated by an arrow e of FIG. 1C. When the etching is obliquely performed, plasma is difficult to be infiltrated into the substrate and at a portion X of FIG. 1C and a "dead zone of etching" occurs. For this reason, residues are easily generated at the portion X. The problem of the "dead zone of etching" becomes serious at an edge of the mask opposite to the scanning direction of the mask. Further, if an angle θ between the scanning direction and the edge of the mask is large, the problem of the "dead zone of etching" becomes serious. For example, the "dead zone of etching" more easily occurs at a portion Y2 than a portion Y1, and at a portion Y3 than a portion Y2 in FIG. 1D.

The method disclosed in Patent Document 1 is a method of etching the non-opening portion 12 for an island shape while the non-opening portion is placed on a mesh 18 in order to prevent an un-etched region from being formed due to the support portion 16 as shown in FIG. 2. If the line width of the mesh is set to be small, for example, smaller than 0.1 mm, the etching is easily performed to the back side of the mesh. Accordingly, the mesh 18 functions to support the non-opening portion 12 for an island shape, and functions as the opening portion 10. Therefore, as shown in FIG. 1, without providing the support portion 16, it is possible to prevent a region, which corresponds to the support portion 16, from remaining as an un-etched region.

However, the mesh 18 generally elongates and contracts due to thermal expansion. When the substrate is heated or the temperature of a reaction region is locally to be high temperature in the manufacturing process, the mesh is heated and may thus elongate and contract due to thermal expansion. When the mesh 18 elongates and contracts due to thermal expansion, the non-opening portion 12 for an island shape placed on the mesh 18 may be moved from a predetermined position due to the elongation and contraction thereof, the deviation of etched/un-etched regions and patterning may be caused.

Further, as shown in Table 1 of Patent Document 1, the mesh portion may not be completely removed by etching conditions. Furthermore, the problem of the "dead zone of etching" is not solved at the portion X of FIG. 1C.

The present invention has been made in consideration of the above-mentioned problems, and it is an object of the present invention to provide a method of manufacturing a material to be etched that can more preferably prevent a region to be etched from remaining as an un-etched region and reduce deviation of etched/un-etched regions.

Means for Solving the Problem

The invention according to claim 1 relates to a method of manufacturing a material to be etched, which manufactures the material to be etched by using an etching mask where a region corresponding to an etched region of an object to be etched is opened and a region corresponding to an un-etched region is not opened and by performing etching through the opened region, wherein the etching includes at least a first etching process and a second etching process performed after the first etching process, the second etching process is a process of etching a region including a region that is not etched by the first etching process, and an un-etched region, which is the same as etched using a virtual etching mask, is formed on the surface of the object by the first and second etching processes.

BRIEF DESCRIPTION OF THE DRAWINGS

FIG. 1D is a view illustrating the method using the etching mask in the related art.

BEST MODE FOR CARRYING OUT THE INVENTION

Embodiments of the present invention will be described below with reference to accompanying drawings. Meanwhile, the embodiment is a merely example for embodying the present invention, and the present invention is not limited to the embodiment.

According to the embodiment, an organic solid layer, which is one of components of an organic EL, is removed by etching. The organic solid layer means at least one of a hole injection layer, a hole transport layer, a light-emitting layer, an electron transport layer, and an electron injection layer. The organic solid layer is etched in the embodiment, but the present invention is not limited thereto. The present invention can be applied to devices requiring an organic film pattern, such as general components of an organic EL display panel, an organic transistor, an organic solar cell, a compound semiconductor, a semiconductor laser, a CNT-FET transistor, and a silicon MOS.

In the embodiment, a first display electrode having resistance against dry etching is formed on a substrate 100, that is, a glass substrate. One or more organic solid layers are formed on the entire surface of the substrate and on the first display electrode. A wet process, such as a spin coat method, a spray method, or a screen printing method, or a dry process such as a vacuum deposition method may be used as a method of forming a layer in this step. Further, the method may be applied to both a high-molecular layer and a low-molecular layer. In this step, all of layers including an organic light-emitting layer may be laminated. The substrate on which the layers are formed is patterned by using the following embodiments.

Figure 1:
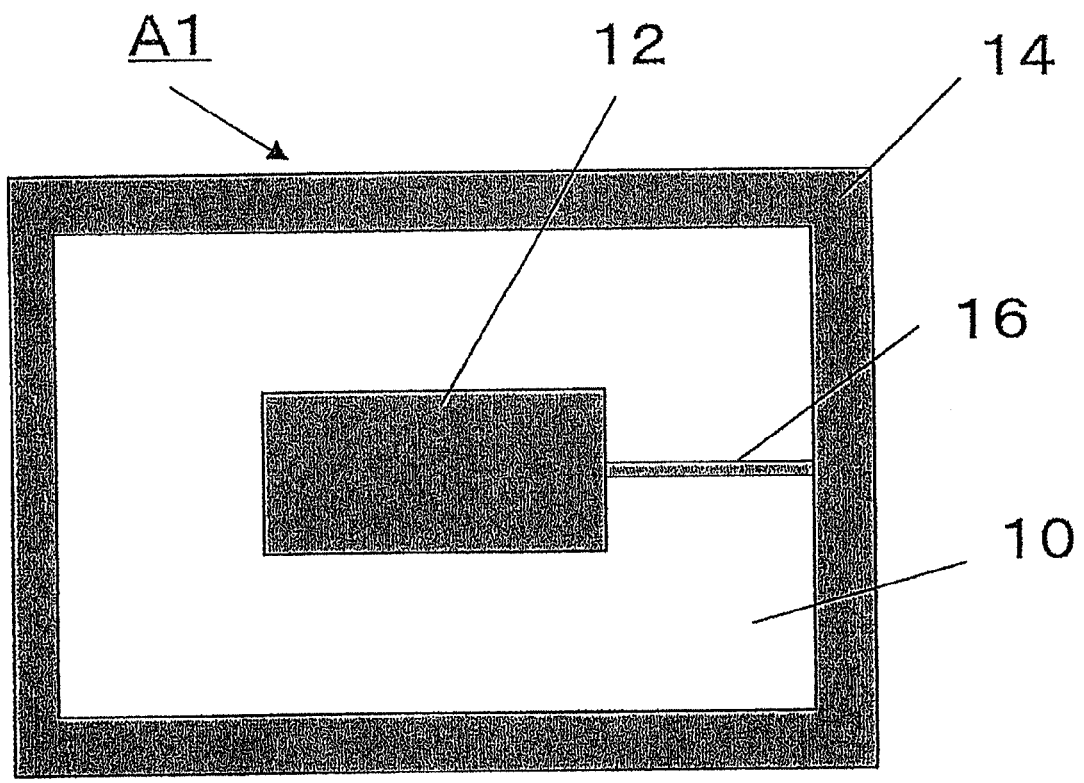
FIG. 1 is a view illustrating a method using an etching mask in the related art.
Figure 1A:
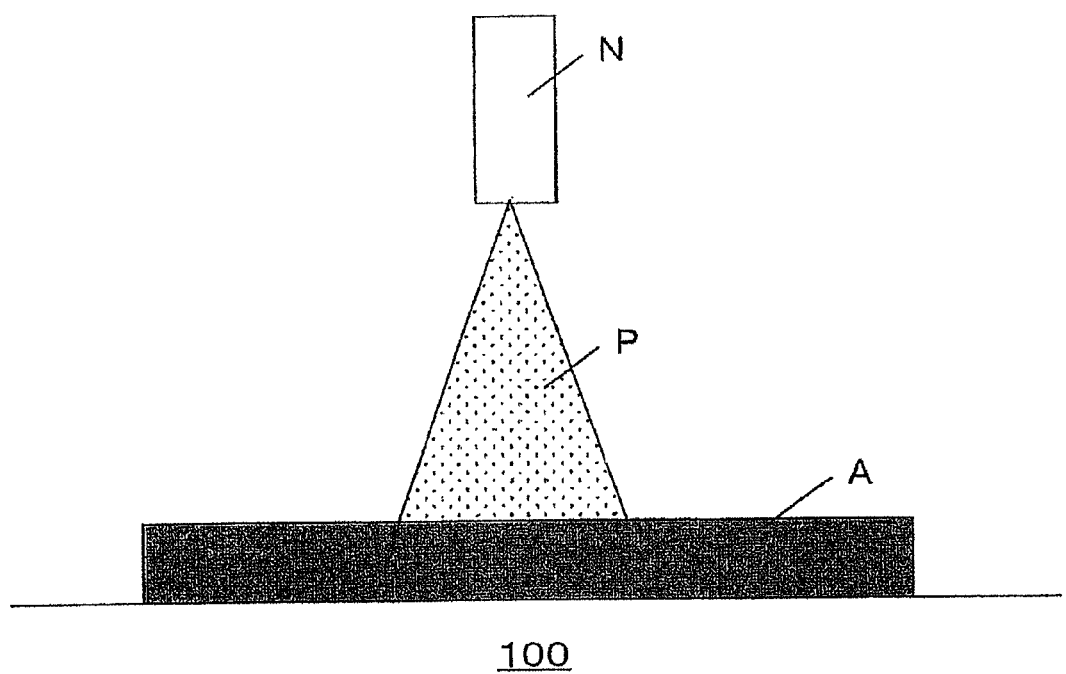
FIG. 1A is a view illustrating the method using the etching mask in the related art.
Figure 1B:
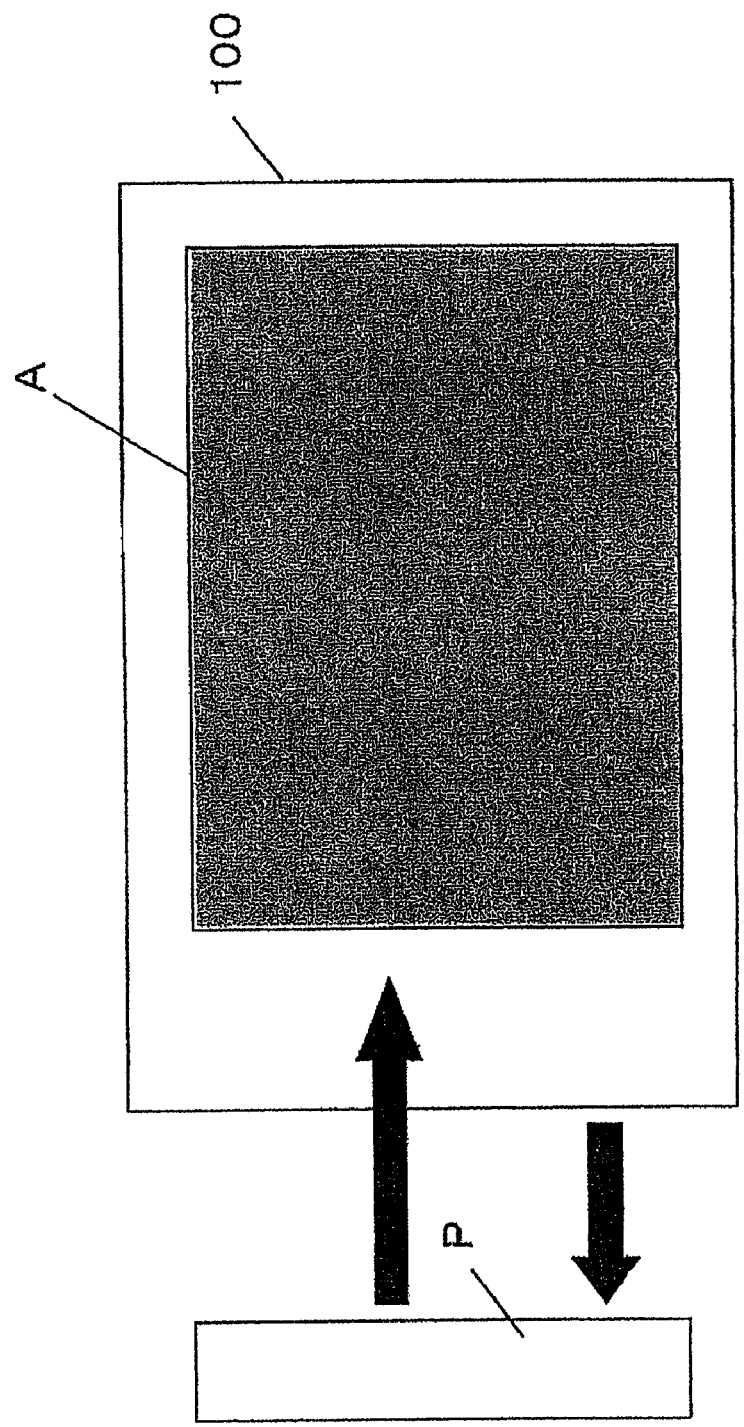
FIG. 1B is a view illustrating the method using the etching mask in the related art.
Figure 1C:
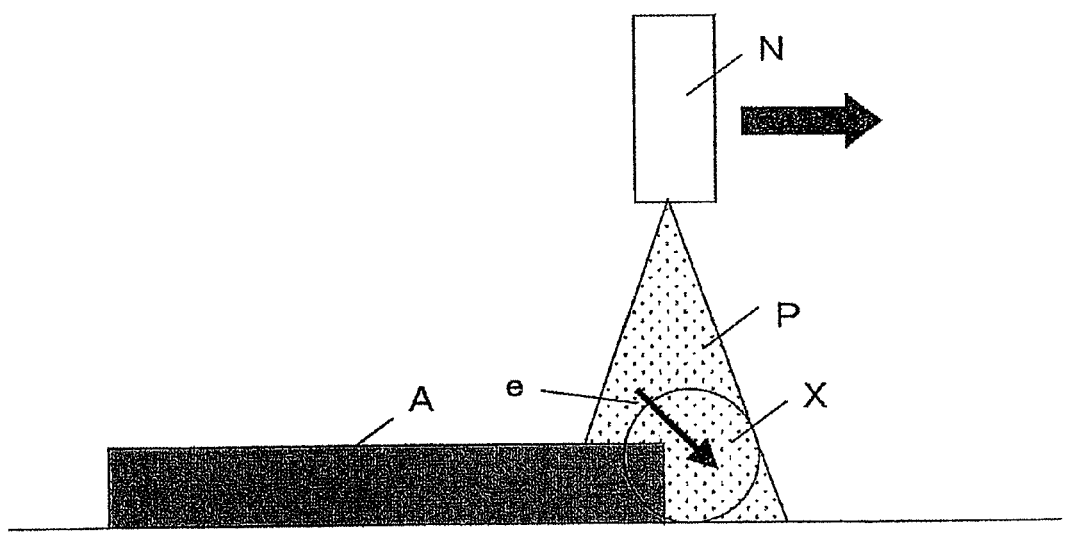
FIG. 1C is a view illustrating the method using the etching mask in the related art.
Figure 2:
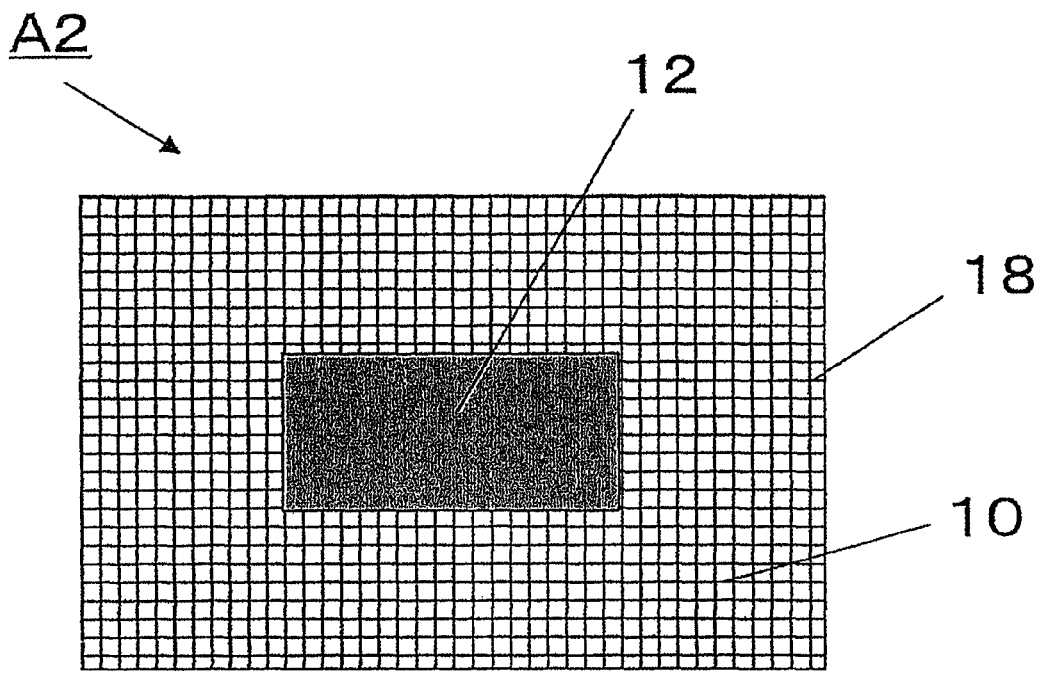
FIG. 2 is a view illustrating the method using the etching mask in the related art.

An etching method is not particularly limited. However, when a method of obliquely performing etching such as an atmospheric-pressure plasma scanning method is used, the present invention is particularly effective. In particular, if an angle between a scanning direction and an edge of the mask opposite to the scanning direction, that is, θ of FIG. 1D is small, a "dead zone of etching" hardly occurs. Therefore, it is suitable that the angle is small. The value of θ is preferably 45° or less, more preferably 20° or less, and most preferably 5° or less. That is, it is preferable that plasma be applied in a direction substantially parallel to the edge of the mask.

Figure 3:
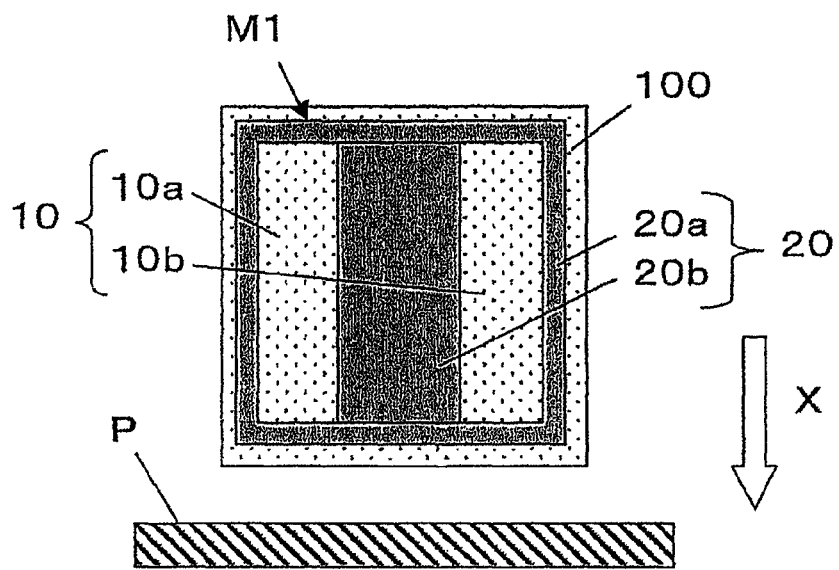
FIG. 3 is a schematic view illustrating a method using an etching mask according to an embodiment.
Figure 3A:
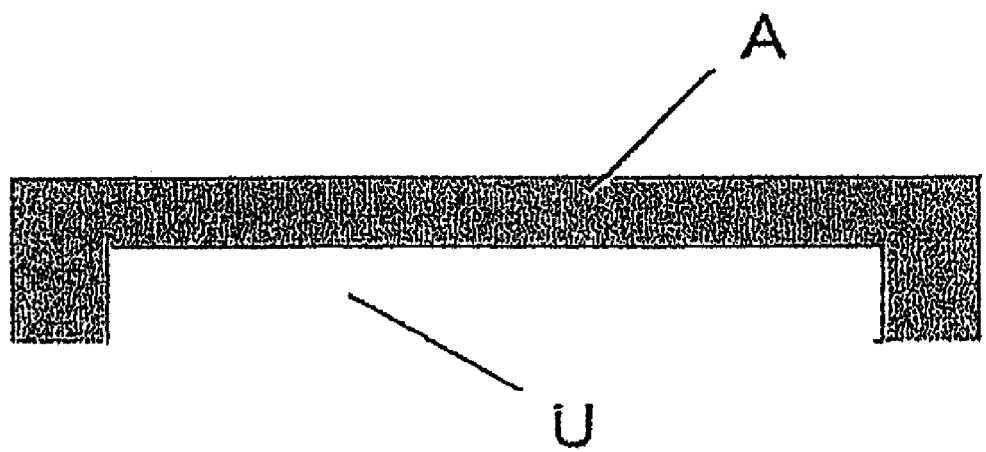
FIG. 3A is a view illustrating an etching mask according to an embodiment.
Figure 3B:
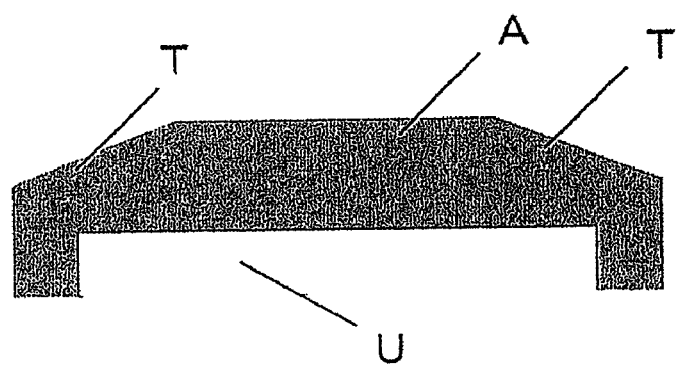
FIG. 3B is a view illustrating an etching mask according to the embodiment.
Figure 3B:
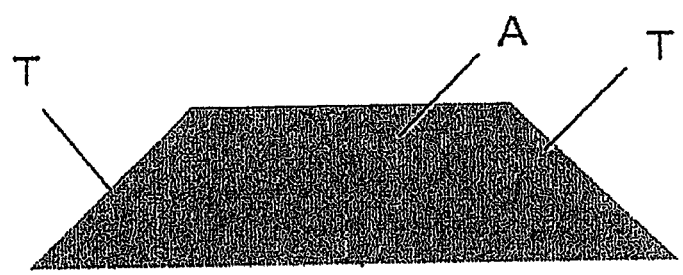

Further, if a recess U is formed on a portion of a mask A as shown in FIG. 3A, an organic layer corresponding to a masked portion of the surface of an object to be etched is hardly damaged. Therefore, it is preferable. Furthermore, if tapered portions T are formed at the edges of the surface of a mask A to which atmospheric-pressure plasma is applied as shown in (1) and (2) of FIG. 3B, it is possible to prevent the "dead zone of etching" from occurring. Therefore, it is more preferable.

First Embodiment

FIG. 3 shows an etching mask (hereinafter, simply referred to as a mask) M1 that is used in dry etching of a first embodiment. FIG. 3 is a schematic plan view of the mask M1 as seen from an object to be etched. The mask M1 includes an opening portion 10 through which the surface to be etched is exposed, and a non-opening portion 20 that covers portions except for the surface to be etched.

As shown in FIG. 3, the mask M1 includes an outer peripheral portion 20a, a first opening portion 10a, a bridge portion 20b, a second opening portion 10b, and the outer peripheral portion 20a in this order from the left side on paper.

The opening portion 10 is composed of the first opening portion 10a and the second opening portion 10b. Each of the first opening portion 10a and the second opening portion 10b has the shape of a substantially rectangular opening. Both upper and lower sides of each of the first opening portion 10a and the second opening portion 10b are formed by boundary lines between the opening portions and the outer peripheral portion 20a. One of left and right sides of each of the first opening portion 10a and the second opening portion 10b is formed by a boundary line between the opening portion and the outer peripheral portion 20a, and the other thereof is formed by a boundary line between the opening portion and the bridge portion 20b.

The non-opening portion 20 is composed of the outer peripheral portion 20a, and the bridge portion 20b that connects an upper portion of the outer peripheral portion 20a with a lower portion of the outer peripheral portion. The bridge portion 20b is formed substantially in a rectangular shape. Both upper and lower sides of the bridge portion are formed by boundary lines between the bridge portion and the outer peripheral portion 20a, and both left and right sides of the bridge portion are formed by boundary lines between the bridge portion and the first and second opening portions 10a and 10b, respectively.

A method, which patterns the substrate 100 by etching in order to manufacture a material (FIG. 6) to be etched, will be described below.

The substrate 100, which is an object to be etched, is disposed below the mask M1. In the state where the mask M1 and the substrate 100 are integrated with each other (hereinafter, simply referred to as a stage), the stage is moved in an X-direction of FIG. 3. An atmospheric-pressure plasma reaction region P is provided at the destination of the stage in the X-direction. The mask M1 and the substrate 100 are integrated with each other. Then, in the state of the stage, the mask and the substrate pass through a region where plasma etching is performed by the atmospheric-pressure plasma reaction region P. When the mask and the substrate pass through the region, plasma etching is performed by the atmospheric-pressure plasma reaction region P. Accordingly, a portion of the substrate 100 corresponding to the opening portion 10 is etched.

As shown in FIG. 3, the stage where the substrate 100 and the mask M1 are integrated with each other is moved in the X-direction, so that a first etching process is performed. When the stage passes through the atmospheric-pressure plasma reaction region P, the surface of the substrate 100 is etched through the opening portion 10. Meanwhile, the region of the substrate 100 corresponding to the non-opening portion 20, which also includes the bridge portion 20, becomes an un-etched region. Accordingly, the portion of the substrate 100 corresponding to the bridge portion 20b remains as an un-etched region 30 (FIG. 4).

If the atmospheric-pressure plasma reaction region P is small relative to the substrate, needless to say, the stage may be moved in the X-direction several times.

Then, a second etching process is performed on the stage on which the first etching process has been performed. The mask M1 is rotated with respect to the substrate 100 by about 90° about a rotation center, that is, the center point of the stage shown in FIG. 3 where the substrate 100 and the mask M1 are integrated with each other, thereby being brought into the state shown in FIG. 4.

Figure 4:
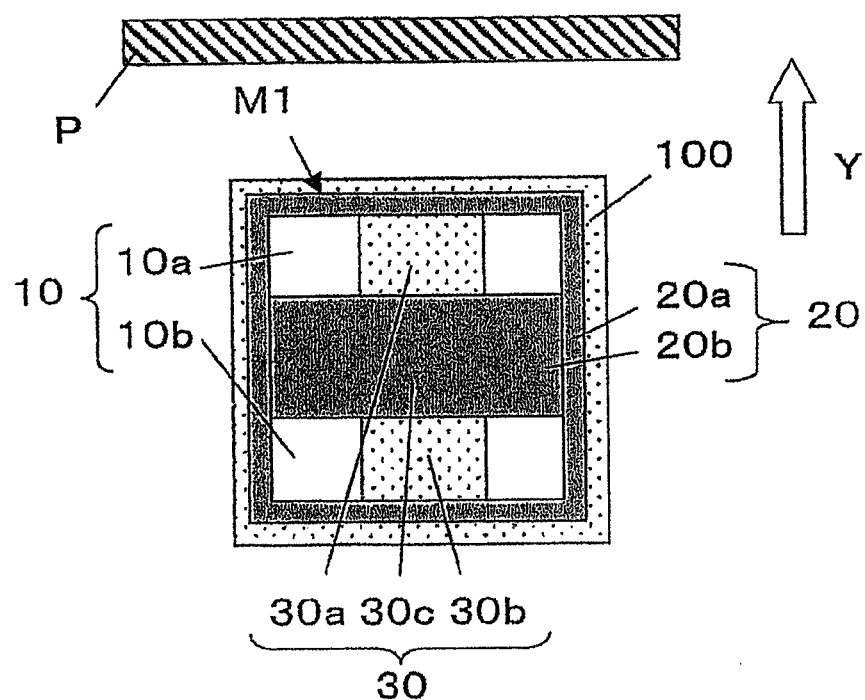
FIG. 4 is a schematic view illustrating a method using the etching mask according to the embodiment.

The stage in the state shown in FIG. 4 is then moved to the region, where etching is performed by the atmospheric-pressure plasma reaction region P, in a direction opposite to the X-direction (in a Y-direction). When the stage passes through the atmospheric-pressure plasma reaction region P, the substrate 100 is etched through the opening portion 10. Meanwhile, the non-opening portion 20 including the bridge portion 20b forms an un-etched region, which is not etched, on the substrate 100. In this case, upper and lower portions 30a and 30b, which correspond to new opening portions formed due to the state shown in FIG. 4, of the un-etched region 30 in the first etching process are etched. In contrast, even in the second etching process, a central portion 30c, which is masked by the bridge portion 20b and formed between the upper and lower portions 30a and 30b, remains as an un-etched region.

Figure 5:
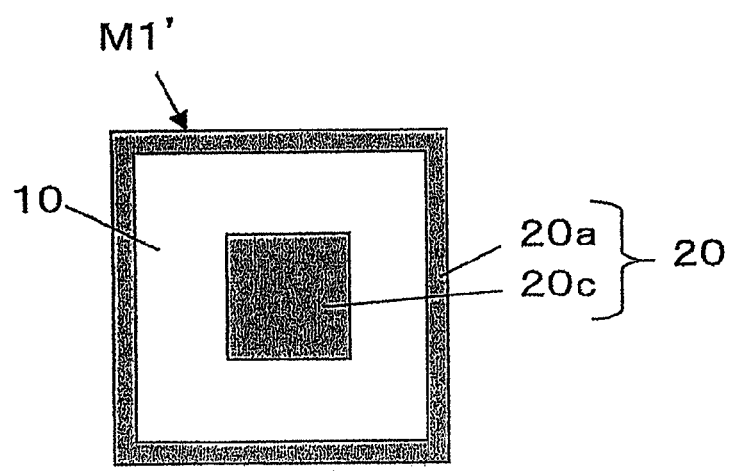
FIG. 5 is a view showing a virtual etching mask according to the embodiment.
Figure 6:
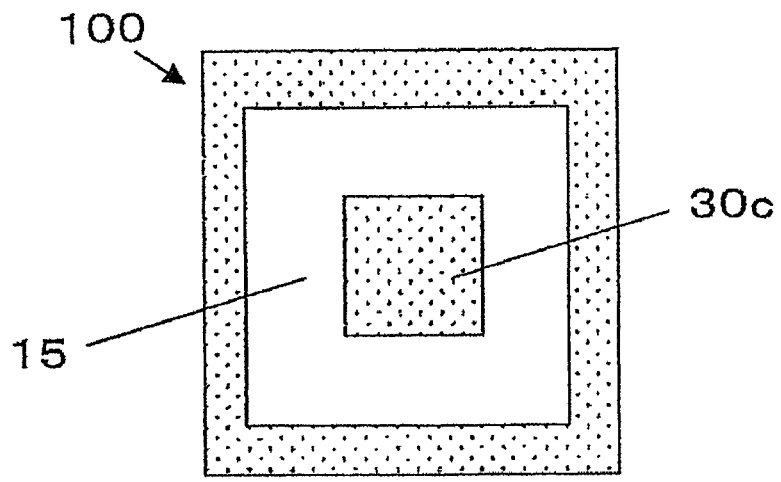
FIG. 6 is a view showing a material to be etched that is manufactured in the embodiment.

When the first etching process and the second etching process are performed in this way, an un-etched region 30c having an island shape, where an un-etched region is surrounded by an etched region like the form etched using a virtual etching mask M1' shown in FIG. 5, may remain on the substrate 100 as shown in FIG. 6.

In detail, the virtual mask M1' shown in FIG. 5 includes an outer peripheral portion 20a as a non-opening portion 20, and an island-shape portion 20c. According to this embodiment, as shown in FIG. 4, the upper and lower portions 30a and 30b of the un-etched region 30, which is masked by the bridge portion 20b and not etched in the first etching process, are etched in the second etching process. Meanwhile, when the first etching process and the second etching process are performed together, the central portion 30c, that is, a substantially square un-etched region that is masked by the bridge portion 20b and not etched in both processes remains. That is, the central portion forms the same etched region as the un-etched region 30c, which is obtained from the etching using the virtual mask M1' shown in FIG. 5.

According to the method of manufacturing a material to be etched of this embodiment, it is possible to perform the same etching as the etching using the virtual mask that includes a substantially square un-etched region 20c at the central portion thereof and is shown in FIG. 5. Accordingly, as shown in FIG. 6, the central portion 30c, that is, an un-etched region corresponding to a substantially square region 20c surrounded by an etched region 15, which is etched by at least one of the first and second etching processes, is formed on the substrate 100.

According to the method of manufacturing a material to be etched of this embodiment, a mesh does not need to be used. Therefore, it is possible to prevent faults such as deviation of patterns that is caused by thermal expansion. Further, since a non-opening portion for an island shape is virtually formed, it is not necessary to provide a support portion that supports the non-opening portion for the island-shaped portion. As a result, it is possible to prevent a portion to be etched from not being etched due to the support portion.

Second Embodiment

Figure 7:
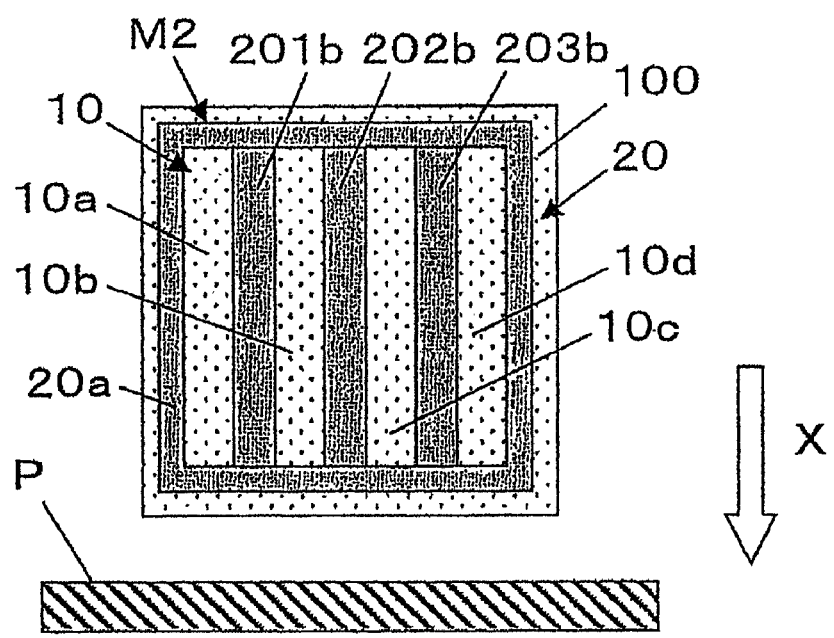
FIG. 7 is a schematic view illustrating a method using an etching mask according to an embodiment.

FIG. 7 shows an etching mask (hereinafter, simply referred to as a mask) M2 that is used in dry etching of a second embodiment. FIG. 7 is a schematic plan view of the mask M2 as seen from an object to be etched. The mask M2 includes an opening portion 10 through which the surface to be etched is exposed, and a non-opening portion 20 that covers portions except for the surface to be etched.

As shown in FIG. 7, the mask M2 includes an outer peripheral portion 20a, a first opening portion 10a, a bridge portion 201b, a second opening portion 10b, a bridge portion 202b, a third opening portion 10c, a bridge portion 203b, a fourth opening portion 10d, and the outer peripheral portion 20a in this order from the left side on paper.

The opening portion 10 is composed of the first opening portion 10a, the second opening portion 10b, the third opening portion 10c, and the fourth opening portion 10d. Each of the first opening portion 10a, the second opening portion 10b, the third opening portion 10c, and the fourth opening portion 10d has the shape of a substantially rectangular opening. Both upper and lower sides of each of the first opening portion 10a, the second opening portion 10b, the third opening portion 10c, and the fourth opening portion 10d are formed by boundary lines between the opening portions and the outer peripheral portion 20a. One of left and right sides of each of the first opening portion 10a and the fourth opening portion 10d is formed by a boundary line between the opening portion and the outer peripheral portion 20a, and the other thereof is formed by a boundary line between the opening portion and the bridge portions 201b and 203b. One of left and right sides of each of the second opening portion 10b and the third opening portion 10c is formed by a boundary line between the opening portion and the bridge portion 202b, and the other thereof is formed by a boundary line between the opening portion and the bridge portions 201b and 203b.

The non-opening portion 20 is composed of the outer peripheral portion 20a, and the bridge portions 201b, 202b, and 203b that connect an upper portion of the outer peripheral portion 20a with a lower portion of the outer peripheral portion. Each of the bridge portions 201b, 202b, and 203b is formed substantially in a rectangular shape. Both upper and lower sides of each of the bridge portions are formed by boundary lines between the bridge portions and the outer peripheral portion 20a. Both left and right sides of each of the bridge portions are formed by boundary lines between the bridge portions and the first, second, third, and fourth opening portions 10a, 10b, 10c, and 10d, respectively.

A method, which patterns the substrate 100 by etching in order to manufacture a material (FIG. 10) to be etched, will be described below.

The substrate 100, which is an object to be etched, is disposed below the mask M2. In the state where the mask M2 and the substrate 100 are integrated with each other (hereinafter, simply referred to as a stage), the stage is moved in an X-direction of FIG. 7. An atmospheric-pressure plasma reaction region P is provided at the destination of the stage in the X-direction. The mask M2 and the substrate 100 are integrated with each other. Then, in the state of the stage, the mask and the substrate pass through a region where plasma etching is performed by the atmospheric-pressure plasma reaction region P. When the mask and the substrate pass through the region, plasma etching is performed by the atmospheric-pressure plasma reaction region P. Accordingly, a portion of the substrate 100 corresponding to the opening portion 10 is etched.

Figure 8:
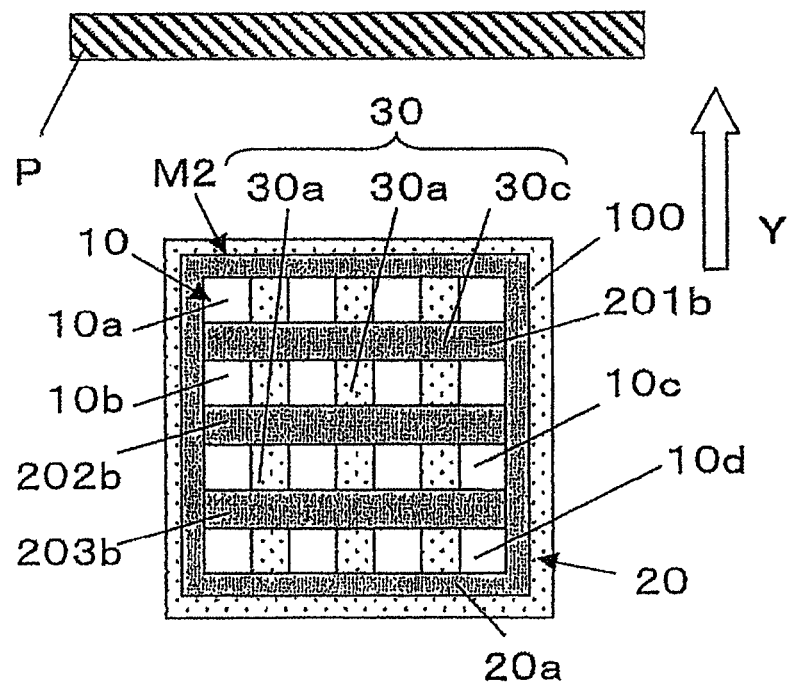
FIG. 8 is a schematic view illustrating a method using the etching mask according to the embodiment.

As shown in FIG. 7, the stage where the substrate 100 and the mask M2 are integrated with each other is moved in the X-direction, so that a first etching process is performed. When the stage passes through the atmospheric-pressure plasma reaction region P, the surface of the substrate 100 is etched through the opening portion 10. Meanwhile, the region of the substrate 100 corresponding to the non-opening portion 20, which also includes the bridge portions 201b, 202b, and 203b, becomes an un-etched region. Accordingly, the portions of the substrate 100 corresponding to the bridge portions 201b, 202b, and 203b remain as an un-etched region 30 (FIG. 8).

Then, a second etching process is performed on the stage on which the first etching process has been performed. The mask M2 is rotated with respect to the substrate 100 by about 90° about a rotation center, that is, the center point of the stage shown in FIG. 7 where the substrate 100 and the mask M1 are integrated with each other, thereby being brought into the state shown in FIG. 8.

The stage in the state shown in FIG. 8 is again moved to the region, where etching is performed by the atmospheric-pressure plasma reaction region P, in a direction opposite to the X-direction (in a Y-direction). When the stage passes through the atmospheric-pressure plasma reaction region P, the substrate 100 is etched through the opening portion 10. Meanwhile, the non-opening portion 20 including the bridge portions 201b, 202b, and 203b forms an un-etched region, which is not etched, on the substrate 100. In this case, portions 30a, which correspond to new opening portions formed due to the state shown in FIG. 8, of the un-etched region 30 in the first etching process are etched. In contrast, even in the second etching process, portions 30c, which are masked by the bridge portions 201b, 202b, and 203b, remain as un-etched regions.

Figure 9:
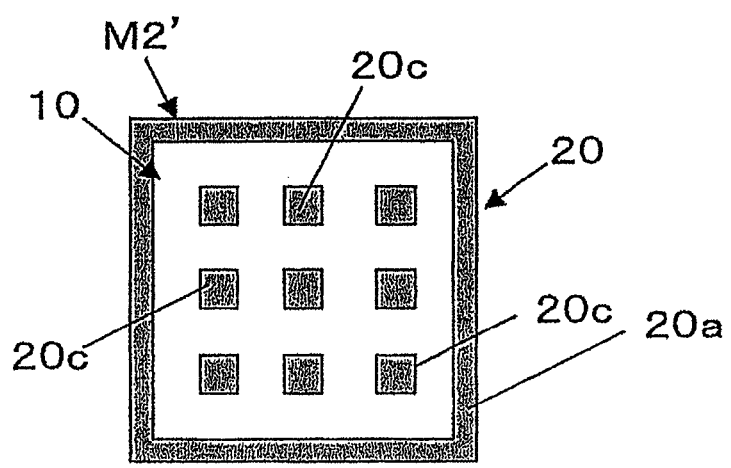
FIG. 9 is a view showing a virtual etching mask according to the embodiment.
Figure 10:
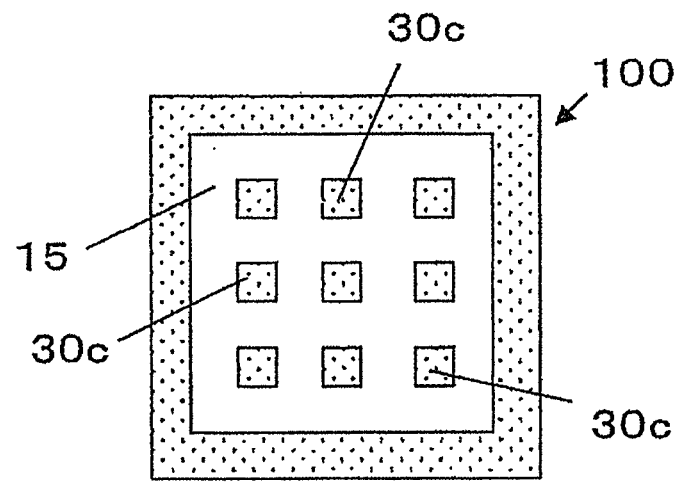
FIG. 10 is a view showing a material to be etched that is manufactured in the embodiment.

When the first etching process and the second etching process are performed in this way, un-etched regions 30c having an island shape, where un-etched regions are surrounded by an etched region like the form etched using a virtual etching mask M2' shown in FIG. 9, may remain on the substrate 100 as shown in FIG. 10.

In detail, the virtual mask M2' shown in FIG. 9 includes an outer peripheral portion 20a as a non-opening portion 20, and island-shape portions 20c. According to this embodiment, as shown in FIG. 8, a part 30a of the un-etched regions 30, which are masked by the bridge portions 201b, 202b, and 203b and not etched in the first etching process, are etched in the second etching process. Meanwhile, when the first etching process and the second etching process are performed together, the portions 30c, that is, substantially square un-etched regions that are masked by the bridge portions 201b, 202b, and 203b and not etched in both processes remain. That is, the portions form the same etched regions as the un-etched regions 30c, which are obtained from the etching using the virtual mask M2' shown in FIG. 9.

According to the method of manufacturing a material to be etched of this embodiment, it is possible to perform the same etching as the etching using the virtual mask that includes substantially square un-etched regions 20c at the central portion thereof and is shown in FIG. 9. Accordingly, as shown in FIG. 10, the portions 30c, that is, un-etched regions corresponding to the substantially square regions 20c surrounded by an etched region 15, which is etched by at least one of the first and second etching processes, are formed on the substrate 100.

According to the method of manufacturing a material to be etched of this embodiment, a mesh does not need to be used. Therefore, it is possible to prevent faults such as deviation of patterns that is caused by thermal expansion. Further, since non-opening portions for island-shaped portions are virtually formed, it is not necessary to provide support portions that support the non-opening portions for the island-shaped portions. As a result, it is possible to prevent portions to be etched from not being etched due to the support portions.

Third Embodiment

According to a third embodiment, unlike the first and second embodiments, different masks are used in first and second etching processes.

Figure 11:
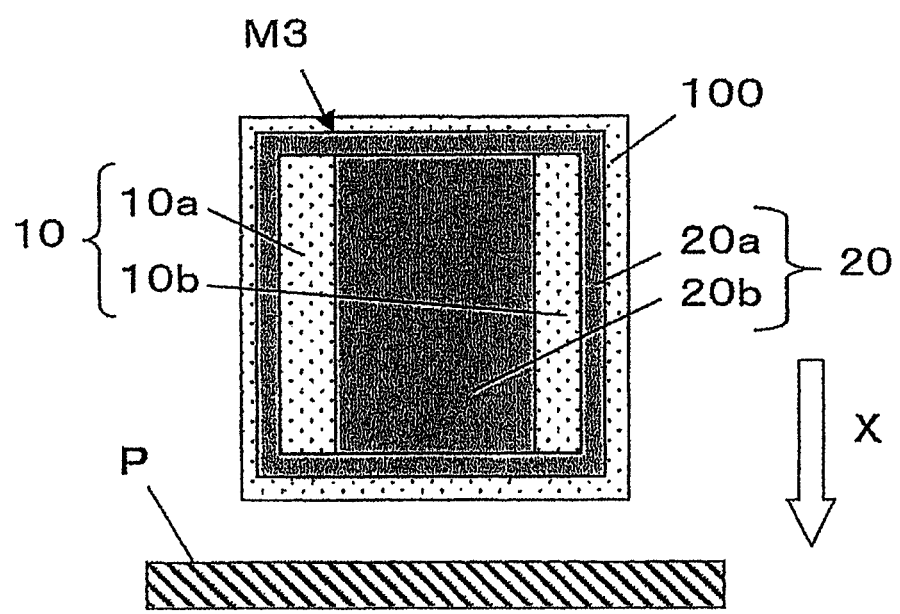
FIG. 11 is a schematic view illustrating a method using an etching mask according to an embodiment.
Figure 12:
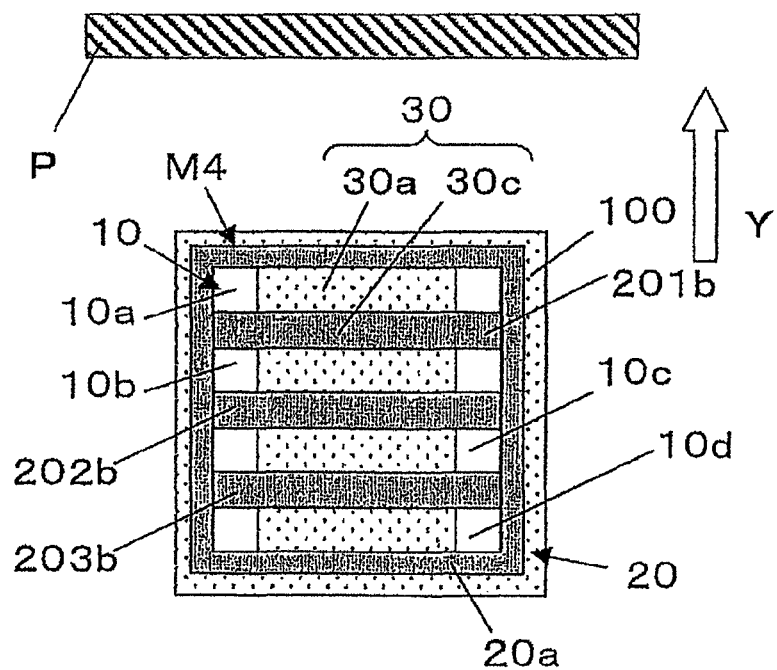
FIG. 12 is a schematic view illustrating the method using the etching mask according to the embodiment.

FIGS. 11 and 12 show etching masks (hereinafter, simply referred to as a mask) M3 and M4 that are used in dry etching of a third embodiment, respectively. FIGS. 11 and 12 are schematic plan views of the masks M3 and M4 as seen from an object to be etched, respectively. Each of the masks M3 and M4 includes an opening portion 10 through which the surface to be etched is exposed, and a non-opening portion 20 that covers portions except for the surface to be etched.

In this embodiment, a first etching process is performed using the mask M3 shown in FIG. 11, and a second etching process is performed using the mask M4 shown in FIG. 12.

As shown in FIG. 11, the mask M3 includes an outer peripheral portion 20a, a first opening portion 10a, a bridge portion 20b, a second opening portion 10b, and the outer peripheral portion 20a in this order from the left side on paper. The horizontal width of the bridge portion 20b is larger than the horizontal width of the bridge portion of the first embodiment. Accordingly, the horizontal width of each of the first and second opening portions 10a and 10b is decreased.

The opening portion 10 is composed of the first opening portion 10a and the second opening portion 10b. Each of the first opening portion 10a and the second opening portion 10b has the shape of a substantially rectangular opening. Both upper and lower sides of each of the first opening portion 10a and the second opening portion 10b are formed by boundary lines between the opening portions and the outer peripheral portion 20a. One of left and right sides of each of the first opening portion 10a and the second opening portion 10b is formed by a boundary line between the opening portion and the outer peripheral portion 20a, and the other thereof is formed by a boundary line between the opening portion and the bridge portion 20b.

The non-opening portion 20 is composed of the outer peripheral portion 20a, and the bridge portion 20b that connects an upper portion of the outer peripheral portion 20a with a lower portion of the outer peripheral portion. The bridge portion 20b is formed substantially in a rectangular shape. Both upper and lower sides of the bridge portion are formed by boundary lines between the bridge portion and the outer peripheral portion 20a, and both left and right sides of the bridge portion are formed by boundary lines between the bridge portion and the first and second opening portions 10a and 10b, respectively.

As shown in FIG. 12, the mask M4 includes an outer peripheral portion 20a, a first opening portion 10a, a bridge portion 201b, a second opening portion 10b, a bridge portion 202b, a third opening portion 10c, a bridge portion 203c, a fourth opening portion 10d, and the outer peripheral portion 20a in this order from the upper side on paper.

The opening portion 10 is composed of the first opening portion 10a, the second opening portion 10b, the third opening portion 10c, and the fourth opening portion 10d. Each of the first opening portion 10a, the second opening portion 10b, the third opening portion 10c, and the fourth opening portion 10d has the shape of a substantially rectangular opening. Both left and right sides of each of the first opening portion 10a, the second opening portion 10b, the third opening portion 10c, and the fourth opening portion 10d are formed by boundary lines between the opening portions and the outer peripheral portion 20a. One of upper and lower sides of each of the first opening portion 10a and the fourth opening portion 10d is formed by a boundary line between the opening portion and the outer peripheral portion 20a, and the other thereof is formed by a boundary line between the opening portion and the bridge portions 201b and 203b. One of upper and lower sides of each of the second opening portion 10b and the third opening portion 10c is formed by a boundary line between the opening portion and the bridge portion 202b, and the other thereof is formed by a boundary line between the opening portion and the bridge portions 201b and 203b.

The non-opening portion 20 is composed of the outer peripheral portion 20a, and the bridge portions 201b, 202b, and 203b that connect a left portion of the outer peripheral portion 20a with a right portion of the outer peripheral portion. Each of the bridge portions 201b, 202b, and 203b is formed substantially in a rectangular shape. Both left and right sides of each of the bridge portions are formed by boundary lines between the bridge portions and the outer peripheral portion 20a. Both upper and lower sides of the bridge portions are formed by boundary lines between the bridge portions and the first, second, third, and fourth opening portions 10a, 10b, 10c, and 10d, respectively.

A method, which patterns the substrate 100 by etching in order to manufacture a material (FIG. 14) to be etched, will be described below.

First, the substrate 100, which is an object to be etched, is disposed below the mask M3. In the state where the mask M3 and the substrate 100 are integrated with each other (hereinafter, simply referred to as a stage), the stage is moved in an X-direction of FIG. 11. An atmospheric-pressure plasma reaction region P is provided at the destination of the stage in the X-direction. The mask M3 and the substrate 100 are integrated with each other. Then, in the state of the stage, the mask and the substrate pass through a region where plasma etching is performed by the atmospheric-pressure plasma reaction region P. When the mask and the substrate pass through the region, plasma etching is performed by the atmospheric-pressure plasma reaction region P. Accordingly, a portion of the substrate 100 corresponding to the opening portion 10 is etched. After that, the mask M3 is replaced with the mask M4, and etching is performed in the same way as described above.

As shown in FIG. 11, the stage where the substrate 100 and the mask M3 are integrated with each other is moved in the X-direction, so that a first etching process is performed. When the stage passes through the atmospheric-pressure plasma reaction region P, the surface of the substrate 100 is etched through the opening portion 10. Meanwhile, the region of the substrate 100 corresponding to the non-opening portion 20, which also includes the bridge portion 20b, becomes an un-etched region. Accordingly, the portion of the substrate 100 corresponding to the bridge portion 20b remains as an un-etched region 30 (FIG. 12).

Then, a second etching process is performed on the stage on which the first etching process has been performed. After the first etching process, the mask M3 is removed from the substrate 100, and the mask M4 is placed instead as shown in FIG. 12. Then, the substrate 100 and the mask M4 are integrated with each other to form a stage.

The stage in the state shown in FIG. 12 is again moved to the region, where etching is performed by the atmospheric-pressure plasma reaction region P, in a direction opposite to the X-direction (in a Y-direction). When the stage passes through the atmospheric-pressure plasma reaction region P, the substrate 100 is etched through the opening portion 10. Meanwhile, the non-opening portions 20 including the bridge portions 201b, 202b, and 203b forms an un-etched region, which is not etched, on the substrate 100. In this case, portions 30a, which correspond to new opening portions formed due to the state shown in FIG. 12, of the un-etched region 30 in the first etching process are etched. In contrast, even in the second etching process, portions 30c, which are masked by the bridge portions 201b, 202b, and 203b, remain as un-etched regions.

Figure 13:
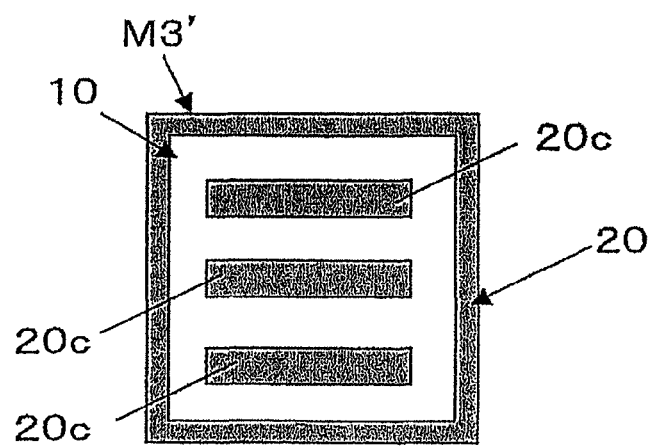
FIG. 13 is a view showing a virtual etching mask according to the embodiment.
Figure 14:
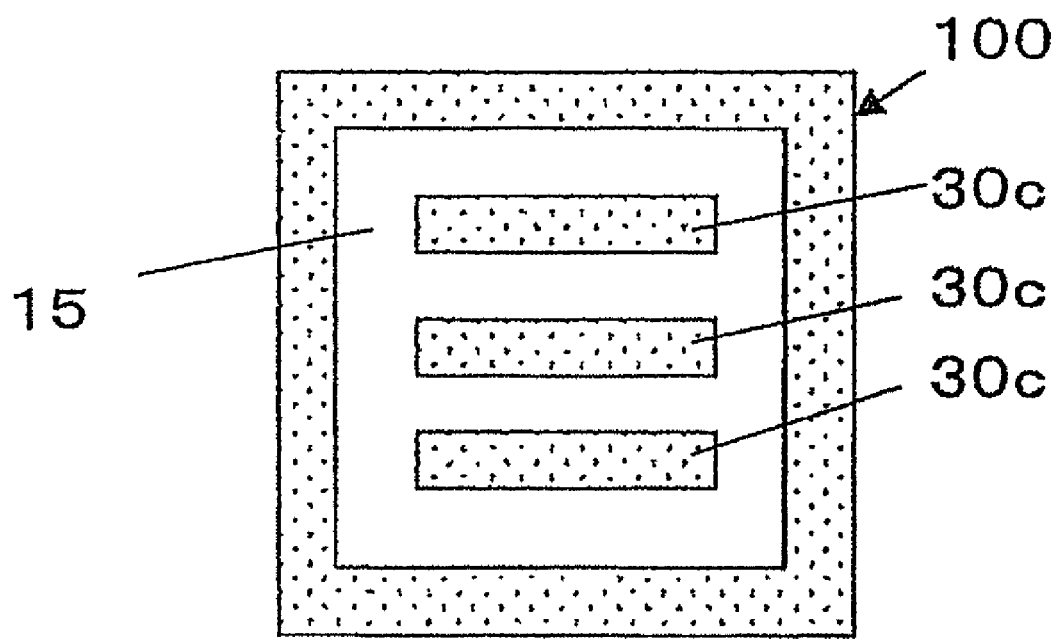
FIG. 14 is a view showing a material to be etched that is manufactured in the embodiment.

When the first etching process and the second etching process are performed in this way, un-etched regions 30c having an island shape, where un-etched regions are surrounded by an etched region like the form etched using a virtual etching mask M3' shown in FIG. 13, may remain on the substrate 100 as shown in FIG. 14.

In detail, the virtual mask M3' shown in FIG. 13 includes an outer peripheral portion 20a as a non-opening portion 20, and island-shape portions 20c. According to this embodiment, as shown in FIG. 12, a part 30a of the un-etched regions 30, which are masked by the bridge portion 20b and not etched in the first etching process, are etched in the second etching process. Meanwhile, when the first etching process and the second etching process are performed together, the central portions 30c, that is, substantially square un-etched regions that are masked by the bridge portions 201b, 202b, and 203b and not etched in both processes remain. That is, the portions form the same etched regions as the un-etched regions 30c, which are obtained from the etching using the virtual mask M3' shown in FIG. 13.

According to the method of manufacturing a material to be etched of this embodiment, it is possible to perform the same etching as the etching using the virtual mask that includes substantially square un-etched regions 20c at the central portion thereof and is shown in FIG. 13. Accordingly, as shown in FIG. 14, the portions 30c, that is, un-etched regions corresponding to the substantially square regions 20c surrounded by an etched region 15, which is etched by at least one of the first and second etching processes, are formed on the substrate 100.

According to the method of manufacturing a material to be etched of this embodiment, a mesh does not need to be used. Therefore, it is possible to prevent faults such as deviation of patterns that is caused by thermal expansion. Further, since non-opening portions for island-shaped portions are virtually formed, it is not necessary to provide support portions that support the non-opening portions for the island-shaped portions. As a result, it is possible to prevent portions to be etched from not being etched due to the support portions.

Fourth Embodiment

It is possible to improve the accuracy of etching by using the first to third embodiments.

First, an appointed region of an object to be etched, which is to be etched by the first etching process, is determined before the first etching process. Then, the first etching process is performed.

After the first etching process before the second etching process, the determined appointed region is compared with the surface of the object that is actually etched by the first etching process. Then, an un-etched appointed region, which is not etched by the first etching process, of the appointed region is decided on the basis of this comparison. After that, the second etching process is performed, and the un-etched appointed region is etched. The determination or decision may be performed by a CPU and a memory of a computer. Further, if the determination of the appointed region to be etched is performed in advance, the determination does not need to be performed in this process. Furthermore, this information may be stored in the memory.

In this embodiment, as described above, an un-etched appointed region of the region, which is to be etched by the first etching process, is etched by the second etching process. Therefore, even though the accuracy of the mask is poor, it is possible to improve the accuracy of etching.

Other Embodiments

A dry etching mask has been used as the mask in the above-mentioned embodiments. However, the mask is not limited thereto, and may be appropriately selected and used. For example, the mask may be made of a conductive material, that is, metal such as nickel or SUS (stainless steel). Alternatively, the mask may be made of an insulating material, such as a resin or ceramic. Further, it is preferable that the mask be as thin as possible (ideally, 1 mm or less) to form sharp edges. Furthermore, it is preferable that a distance between the substrate and the mask be as small as possible (1 mm or less).

In the above-mentioned embodiments, the etching has been performed while the stage is moved. However, the etching method may be appropriately selected and applied. For example, a stage is provided in a chamber, and may be completely etched through a mask in the chamber.

In the above-mentioned embodiments, the movement of relative positions of the substrate and the mask has been performed by moving the mask while the substrate is stationary. However, a method of moving the relative positions is not limited thereto, and may be appropriately selected and applied. For example, a substrate may be moved while a mask is stationary. Alternatively, relative movement may be performed by moving both a mask and a substrate.

A moving method, a moving procedure, and the like may be appropriately selected in the above-mentioned embodiments. For example, a moving method using a stage robot may be applied to move the stage.

In the above-mentioned embodiments, there has been described a method of forming an island-shaped un-etched region surrounded by an etched region, that is, a method of performing first and second etching processes so that the surface not etched by the first and second etching processes is surrounded by the surface etched by at least one of the first and second etching processes. However, the present invention is not limited to the embodiments, and may be applied to other method other than island-shaped patterning. Further, the pattern has had a quadrangular shape, such as a substantially rectangular or square shape. However, the present invention may be generally applied to polygonal patterns, such as hexagonal (so-called "star-shaped") patterns, and rounded patterns such as circular and oval patterns.

In the above-mentioned embodiments, the only first and second etching processes have been performed, but other processes such additional etching processes may be additionally performed. Further, it is enough that an etching apparatus such as an atmospheric-pressure plasma reaction region P can perform etching at a position corresponding to an opening portion, and an etching apparatus capable of performing etching on the entire surface does not need to be provided.

The invention claimed is:

1. A method of manufacturing a material to be etched, which manufactures the material to be etched by using an etching mask where a region corresponding to an etched region of an object to be etched is opened and a region corresponding to an un-etched region is not opened and by performing etching through the opened region,
   wherein the etching includes at least a first etching process and a second etching process performed after the first etching process,
   the second etching process is a process of etching a region including a region that is not etched by the first etching process,
   the etching mask used in at least the first and second etching processes is used in both of the etching processes,
   a positional relationship between the surface of the object to be etched and the etching mask is relatively changed after the first etching process, and
   by this change, after the opened region of the etching mask is caused to correspond so as to include the region that is not etched and the region that is etched by the first etching process, the second etching process is performed,
   the result obtained after completing the first and second etching processes is the same result that would have been achieved if the first and second etching processes were to have been carried out in a one-step etching process using a virtual mask, wherein the virtual mask is a single mask that corresponds to the superposition of two separate masks where one mask is moved relative to the other, and
   a recess is formed on the surface of the etching mask that covers the object to be etched.

2. The method of manufacturing a material to be etched according to claim 1, further comprising, after the first etching process before the second etching process:
   a comparing process of comparing a region that was intended to have been etched by the first etching process to a region that actually is etched by the first etching process; and
   a deciding process of deciding an un-etched appointed region, which is not etched by the first etching process, of the appointed region to be etched, on the basis of this comparison,
   wherein the etching of the second etching process is performed for a region including the un-etched appointed region.

3. The method of manufacturing a material to be etched according to claim 1,
   wherein the first and second etching processes are performed so that the surface not etched by the first and second etching processes is surrounded by the surface etched by at least one of the first and second etching processes.

4. The method of manufacturing a material to be etched according to claim 1,
   wherein the material to be etched is used as a component of an organic EL device.

5. The method of manufacturing a material to be etched according to claim 1,
   wherein etching means and the object to be etched are moved relative to each other in at least one of the first and second etching processes.

6. The method of manufacturing a material to be etched according to claim 5,
   wherein an angle between a moving direction of etching and an edge of the mask is 45° or less.

* * * * *